(12) United States Patent
Couillard et al.

(10) Patent No.: US 7,071,022 B2
(45) Date of Patent: Jul. 4, 2006

(54) SILICON CRYSTALLIZATION USING SELF-ASSEMBLED MONOLAYERS

(75) Inventors: J. Greg Couillard, Ithaca, NY (US); Robert R. Hancock Rr, Corning, NY (US); Mark A. Lewis, Corning, NY (US)

(73) Assignee: Corning Incorporated, Corning, NY (US)

( * ) Notice: Subject to any disclaimer, the term of this patent is extended or adjusted under 35 U.S.C. 154(b) by 36 days.

(21) Appl. No.: 10/622,606

(22) Filed: Jul. 18, 2003

(65) Prior Publication Data

US 2005/0011434 A1    Jan. 20, 2005

(51) Int. Cl.
*H01L 21/00* (2006.01)

(52) U.S. Cl. .................. 438/97; 438/150; 438/166; 438/488

(58) Field of Classification Search ............ 438/97, 438/150, 166, 488
See application file for complete search history.

(56) References Cited

U.S. PATENT DOCUMENTS

| | | | |
|---|---|---|---|
| 5,147,826 A | 9/1992 | Liu et al. ............... 437/233 |
| 5,352,485 A | 10/1994 | DeGuire et al. ......... 427/226 |
| 5,751,018 A | 5/1998 | Alivisatos et al. ....... 257/64 |
| 5,879,970 A | 3/1999 | Shiota et al. ............ 438/151 |
| 5,940,693 A | 8/1999 | Maekawa ............... 438/166 |
| 6,225,197 B1 | 5/2001 | Maekawa ............... 438/487 |
| 6,241,817 B1 | 6/2001 | Jang et al. .............. 117/8 |
| 6,432,757 B1 | 8/2002 | Noguchi et al. .......... 438/166 |
| 6,448,118 B1 | 9/2002 | Yamazaki et al. ........ 438/166 |
| 6,464,780 B1 | 10/2002 | Mantl et al. ............. 117/90 |
| 6,596,116 B1 | 7/2003 | Bian et al. .............. 428/651 |
| 2001/0012567 A1* | 8/2001 | Saitoh et al. ............. 428/472 |
| 2005/0012099 A1* | 1/2005 | Couillard et al. .......... 257/66 |

FOREIGN PATENT DOCUMENTS

| | | |
|---|---|---|
| EP | 0 598 361 | 5/1994 |
| EP | 0598361 | 5/1994 |
| EP | 0 651 431 | 5/1995 |
| EP | 1 119 053 | 7/2001 |
| WO | WO03/057949 | 7/2003 |

OTHER PUBLICATIONS

Niesen, et al.; "Chemical liquid deposition of gallium nitride thin films on siloxane-anchored self-assembled monolayers"; Materials Chemistry and Physics 73 (2002) pp. 301-305.

X. Xu, Joseph Cesarano III, Eileen Burch, Gabriel P. Lopez, "Template-assisted electrochemical deposition of ultrathin films of cadmium sulfide", Thin Solid Films 305 (1997) 95-102.

(Continued)

*Primary Examiner*—Thien F. Tran
(74) *Attorney, Agent, or Firm*—Thomas R. Beall

(57) ABSTRACT

A display device comprises a substrate having a layer of crystalline or polycrystalline semiconductor material disposed over the substrate, wherein the substrate has a strain point that is lower than a forming temperature of the layer. The crystalline or polycrystalline material is fabricated by a method that includes providing a self-assembled monolayer (SAM) over the substrate, depositing a layer of material over the SAM, and substantially crystallizing the layer.

9 Claims, 4 Drawing Sheets

OTHER PUBLICATIONS

D. Ji et al., "Improved protein crystallization by vapor diffusion from drops in contact with transparent, self-assembled monolayers on gold-coated glass coverslips", Journal of Crystal Growth 218 (2000) 390-398.

Joanna Aizenberg, Andrew J. Black and George M. Whitesides, "Control of crystal nucleation by patterned self-assembled monolayers", Nature, vol. 398, Apr. 1999, pp. 495-498.

R. Staub et al., "Scanning tunneling mircroscope investigations of organic heterostructures prepared by a combination of self-assembly and molecular beam epitaxy", Surface Science 445 (2000) 368-379.

J. Flath et al., "Nucleation and growth of semiconductor particles on self-assembled monlayers by chemical solution deposition", Thin Solid Films 327-329 (1998) 506-509.

H. Lin et al., "Preparation of Ti02 films on self-assembled monolayers by sol-gel method", Thin Solid Films 315 (1998) 111-117.

Hansuk Kim, J. Greg Couillard, and Dieter G. Ast, "Kinetics of silicide-induced crystallization of polycrystalline thin-film transistors fabricated from amorphous chemical-vapor deposition silicon", Applied Physics Letters, vol. 72, No. 7, Feb. 16, 1998, pp. 803-805.

Agarwal et al, "Synthesis of ZrO2 and Y2O3-Doped ZrO2 Thin Films Using Self-Assembled Monolayers", Journal of the American Ceramic Society, 80 (12) 2967-81 (1997).

N.D. Zakharov et al., "Structure and optical properties of Ge/Si superlattice grown at Si substrate by MBE at different temperatures", Materials Science and Engineering B87 (2001) 92-95.

* cited by examiner

SILICON CRYSTALLIZATION USING SELF-ASSEMBLED MONOLAYERS

BACKGROUND

Often in display devices, it is useful to incorporate electronic components onto a glass substrate used in the display device. This is especially the case in flat panel display (FPD) devices such as liquid crystal displays (LCD's). In LCD devices, a layer of liquid crystal material is modulated by voltages, which are controlled using electronic components including transistor arrays. Typically, the transistors of the arrays are thin-film transistors (TFT), and are metal oxide semiconductor (MOS) devices.

The LCD displays often comprise a glass substrate with the transistors disposed over the glass substrate and beneath a layer of LC material. The transistors are arranged in a patterned array, and are driven by peripheral circuitry to provide desired switching voltages to orient the molecules of the LC material in the desired manner. Moreover, the transistors of the array are often formed directly on or over the glass substrate from a semiconductor material.

Because the mobility of carriers of a semiconductor is generally greater in crystalline and polycrystalline materials compared to amorphous materials, it is beneficial to grow crystalline structures on or over the glass substrate of the LCD display and fabricating the transistors therefrom. However, for reasons of uniformity and smoothness, the semiconductor films are typically deposited in an amorphous state and then converted to a polycrystalline structure. Typically, these crystalline structures are polycrystalline structures.

Known methods of semiconductor crystalline growth often require annealing a layer of amorphous semiconductor materials at relatively high temperatures or for long time periods. Because the annealing temperatures for crystal growth are too great for the substrate over which the semiconductor crystals are formed, or to speed manufacturing time, other techniques have been explored to meet this desired end. These techniques include laser annealing.

While various techniques have been attempted to form polycrystalline silicon on glass substrates, there are deficiencies in both the resultant material's characteristics and from the perspective of economic feasibility. As such, what is needed is a method of fabricating semiconductor materials over substrates and the structures formed thereby that overcomes at least the deficiencies of the known techniques.

SUMMARY

In accordance with an exemplary embodiment, a display device comprises a substrate having a monocrystalline or polycrystalline material disposed thereover, wherein the substrate has a strain point that is lower than a forming temperature of the monocrystalline or polycrystalline material.

In accordance with another exemplary embodiment, a method of fabricating a monocrystalline or polycrystalline material over a substrate includes providing a self-assembled monolayer (SAM) over the substrate, depositing a layer over the SAM, and substantially crystallizing the layer.

BRIEF DESCRIPTION OF THE DRAWINGS

The invention is best understood from the following detailed description when read with the accompanying drawing figures. It is emphasized that the various features are not necessarily drawn to scale. In fact, the dimensions of the various features may be arbitrarily increased or decreased for clarity of discussion.

DETAILED DESCRIPTION

In the following detailed description, for purposes of explanation and not limitation, exemplary embodiments disclosing specific details are set forth in order to provide a thorough understanding of the exemplary embodiments. However, it will be apparent to one of ordinary skill in the art that the present invention may be practiced in other embodiments that depart from these specific details. In other instances, detailed descriptions of well-known devices and methods are omitted so as to not obscure the description of the present invention.

Figure 1:
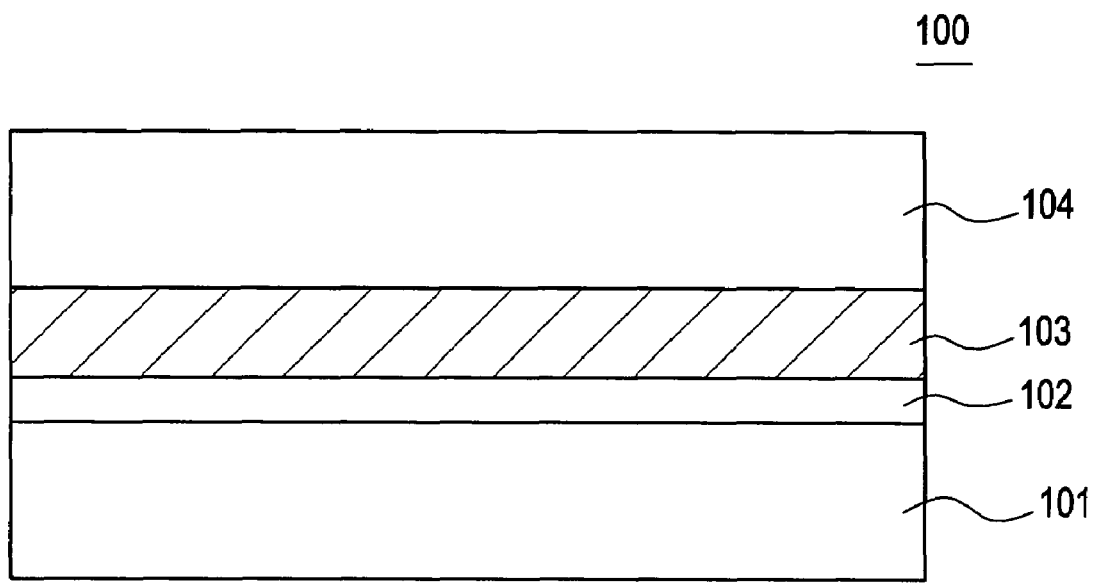
FIG. 1 is a cross-sectional view of a LCD display in accordance with an exemplary embodiment.

FIG. 1 shows a cross-sectional view of an LCD display 100 in accordance with an exemplary embodiment. The display 100 may be of a flat panel display, a head-up display or similar device. It is noted the embodiments described may be implemented in applications other than those specifically mentioned. To wit, the embodiments specifically disclosed are intended to be illustrative and not limiting of the applications of the embodiments.

The display 100 includes a substrate 101, which may be a glass material suitable for video display devices. Exemplary materials include, but are not limited to, Code 1737 and Eagle$^{2000}$™ glass by Corning Incorporated, as well as other borosilicate and aluminosilicate glasses. A layer 102 of monocrystalline or polycrystalline (poly) material, is formed over the substrate 101. In an exemplary embodiment layer 102 is a monocrystalline or polycrystalline semiconductor such as silicon. Optional barrier layers (not shown) may be formed between the substrate 101 and layer 102. Electronic devices (not shown) are fabricated from this layer 102. In accordance with exemplary embodiments, the electronic devices are MOS transistors used to selectively switch on and off voltage sources.

The layer 102 is fabricated using a self-assembled monolayer (SAM) that is chosen to introduce a seeding effect that lowers the crystallization temperature and speeds the nucleation of seed crystals. This results in relatively large grain sizes at lower temperatures and in a shorter time period, and/or with greater film uniformity, than by known crystal growth techniques. This is particularly advantageous in applications where fabricating monocrystalline or polycrystalline materials (e.g., silicon) is useful, but where there are temperature constraints placed on the fabrication process. For example, in instances where a glass substrate cannot be subjected to the temperature required for growing silicon crystal by known thermal growth techniques. Further details of the fabrication of layer 102 and advantages thereof are described in connection with illustrative embodiments herein.

A layer of liquid crystal (LC) material 103 is disposed over the layer 102, and has a transparent conductive material (not shown) such as ITO therein. The conductive layer enables the application of voltages selectively to the LC material 103, whereby light incident thereon is modulated by the LC material 103. Finally, another glass layer 104 is disposed over the liquid crystal material 103 to complete the structure of the display 100. It is noted that other elements needed for the overall function of an LCD device are neither shown nor described, as these are not essential to an understanding of the present illustrative embodiments. These elements are, however, known to one skilled in the art.

The description that follows is drawn primarily the exemplary embodiments for fabricating a layer (e.g., layer 102) of poly or monocrystalline silicon over the glass substrate of the LCD device 100. However, as will become clearer as the present description continues, the exemplary methods may be useful in fabricating other layers of crystalline (mono or poly) materials on a substrate generally, or for fabricating mono or poly crystalline silicon on a substrate for use in other applications, or both.

For example, the substrate may be an oxide of germanium and the crystalline layer may be germanium. Alternatively, the glass substrate may be an oxide of silicon or germanium, with a SiGe crystalline structure formed thereover. Additionally, the substrate may be crystalline silicon, with a crystalline oxide structure formed thereover. Furthermore, the layer may be used in other applications than LCD displays, such as organic light emitting diode (OLED) displays and silicon-on-insulator (SOI) electronic applications.

Characteristically, the methods of the exemplary embodiments produce single crystal films or polycrystalline films. Beneficially, the crystal grains have a preferred orientation. Illustratively, the orientation is a hexagonal face parallel to the substrate (e.g., Si <111>). Finally, because there is a higher degree of order to the grains, the carriers of the crystalline material as a whole will have more uniform mobility than films fabricated using known methods.

FIGS. 2a–2e are cross-sectional views of a process 200 of fabricating a mono or poly crystalline layer of silicon on a glass substrate in accordance with exemplary embodiments.

Figure 2A:
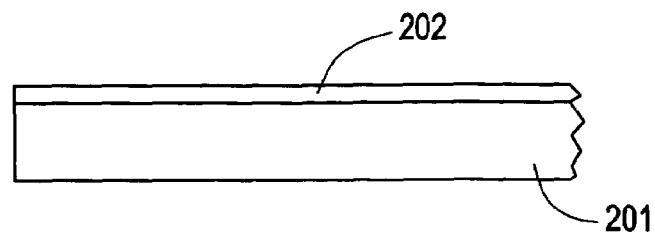
FIGS. 2a–2e are cross-sectional views of an illustrative process of forming crystalline structure on a glass substrate in accordance with an exemplary embodiment.

Initially, as shown in FIG. 2a, a protective layer 202 is formed over a glass substrate 201. Illustratively the glass substrate is the substrate of a display device for an LCD such as that of FIG. 1. The protective layer 202 is illustratively silicon nitride, silicon dioxide, or a combination of the two. The layer 202 is typically deposited by chemical vapor deposition (CVD) to a thickness of 100 to 500 nm.

Figure 2B:
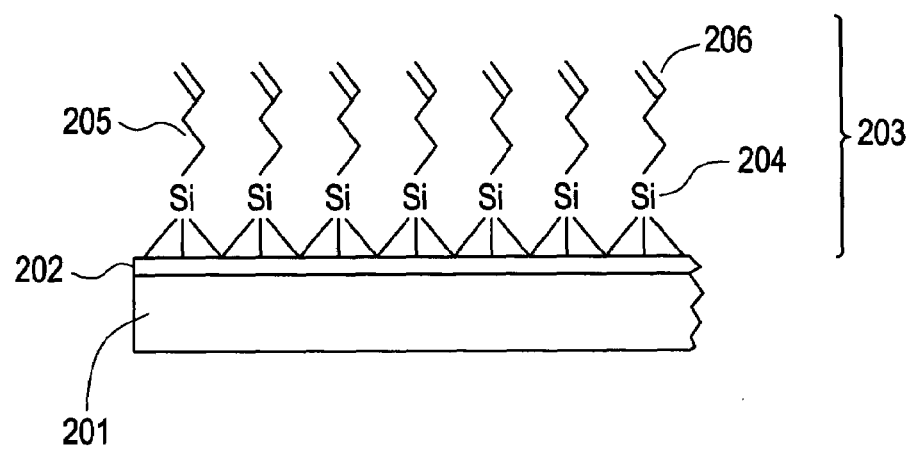
Figure 2C:
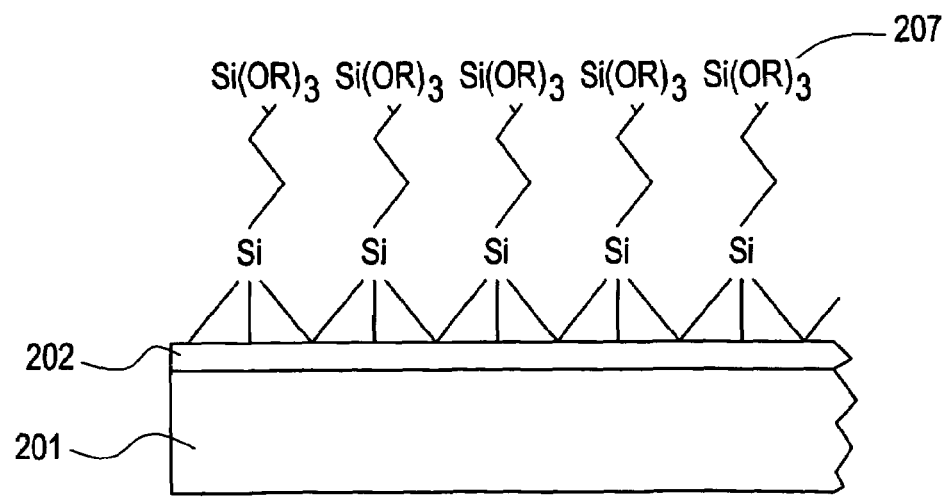

Next, as shown in FIG. 2b, a SAM layer 203 is disposed over the protective layer 202. Illustratively the SAM layer 203 is an organic molecular material that bonds to the glass substrate 201, and is deposited by dip coating, for example. The structure of the organic material of the SAM layer 203 is chosen for its resemblance to the crystalline spacing of the crystal (e.g., Si), which is desirably formed over the glass substrate 201. To this end, the SAM layer 203 consists of close-packed, highly ordered arrays of long-chained hydrocarbon molecules, which form a hexagonal structure.

The ordered structure of the SAM usefully contains the Si atoms 204 bonded to the unbonded oxygen orbitals of the surface of the glass substrate 201 or the protective layer 202. The hydrocarbon chain 205 of the SAM is as shown. By virtue of the structure of the molecules of the SAM layer 203, a seeding layer of exposed functional groups 206 is formed over the surface of the glass substrate in a periodic array that is substantially the same as crystalline silicon. Stated differently, the silicon atoms 204 are a part of the SAM molecules of the SAM layer 203. The ordering of the SAM molecules results in an ordering of the exposed functional groups 206 that is substantially the same as a plane of a silicon crystal. As such, the exposed functional groups form a periodic potential (seed layer) for crystallization by later-deposited amorphous Si. It is noted that the molecular spacing of the SAM determines the seeding effect. This is most sensitive to the spacing between hydrocarbon chains 205, but less so between the attachment silicon atoms 204.

According to an exemplary embodiment, a characteristic of the SAM material required for fabricating crystalline material is the order and spacing of the molecules of the hydrocarbon chain 205, and particularly, of the exposed functional groups 206 at the end of the SAM as discussed more fully below. The order and spacing of the SAM molecules are chosen to substantially match those of a silicon lattice, so that a silicon crystalline structure may be subsequently fabricated. As can be readily appreciated by one of ordinary skill in the art, according to the fabrication principles of the exemplary embodiments described herein, by selecting a SAM material with a suitable spacing, the fabrication of other crystalline structures (e.g., poly or mono crystalline Ge or SiGe) can be effected on a substrate, which is not conducive to fabricating these crystalline materials by known techniques.

In accordance with an exemplary embodiment of the SAM layer 203 used for forming monocrystalline or polycrystalline silicon is illustratively comprised of a material of the composition R—$(CH_2)_N$—Si—$R'_3$. Examples of such a molecule may include undecenyltrichlorosilane ($C_{11}H_{21}Cl_3Si$) or docosenyltriethoyxsilane ($C_{28}H_{58}O_3Si$). It is noted that to form monocrystalline silicon, or other monocrystalline materials in referenced exemplary embodiments, long-range order of the particular SAM material is beneficial. This is achieved through chain lengths of N=8 to 20, with the highest degree of ordering around N=16.

The attachment of the SAM layer 203 to the surface of the substrate 201/protective layer 202 can be accomplished by several routes. When the substrate 201 is glass, silane chemistries may be used to that end. It is further noted that the R' groups are cleaved to allow the Si atoms 204 to attach to the oxygen of the glass as referenced above. Alkoxy silanes or trihalo silanes are typically used, with the silane being hydrolized and condensed to form a siloxane polymer. The silanes would contain, or could be modified to contain, reactive functionality such that $SiH_4$ would react to form the base layer for silicon growth. Examples of suitable attachment groups include chlorosilane (—$SiCl_3$), methoxysilanes (—$Si(OCH_3)_3$), and ethoxysilanes (—$Si(OCH_2CH_3)_3$).

Another method of modifying the surface of a glass substrate would utilize positively charged species such as quartenary amines, phosphoniums or sulfoniums. Positively charged groups are chosen since the surface silanols of the glass substrate are acidic (pH~3–5) and give the glass a bulk negative charge. These are also highly orientated systems that could contain the desired pendent functionality for reaction with the $SiH_4$ in any of the aforementioned reaction mechanisms.

In general, in order to form monocrystalline or polycrystalline silicon in accordance with exemplary embodiments it is useful for the SAM material to be comprised of silicon-terminated organic molecules, or of organic molecules terminated with a functional site such as an alkene that is favorable for silicon attachment.

According to an exemplary embodiment, during CVD deposition of silicon, (e.g., as described in connection with the embodiments of FIGS. 2c and 2d below) the pendent functionality of the SAM 203 must interact and bond with species from the $SiH_4$ plasma typically used to deposit silicon. The nature of the interaction, or specifically the mechanism, is based on the reactions typically associated with the starting materials.

The $SiH_4$ plasma is by definition a high energy system whereby radicals are produced. These radicals are then the species that the design of the SAM system should take into account. A typical organic functional group that could involve radicals is the carbon double bond or alkene. Since the $SiH_4$ has both silicon and hydrogen, addition to the double bond can be completed without any secondary reagents. With the formation of the carbonsilyl hydride on the surface of the substrate, normal silicon growth can occur.

Another pendent functional group that addresses the radical nature of the plasma involves the use of spin labels or spin traps. These are organic groups typically used for Electron Spin Resonance (ESR) studies (such as the N-oxyl) that have an unpaired electron that is stable. These molecules can interact with other radicals to form fully spin paired species. As such, the spin traps can interact with the $SiH_4$ plasma forming an N-silyloxy hydride group that could then, as above, allow for normal silicon growth.

Another property of the $SiH_4$ group is that it is highly pyrophoric when exposed to air. This highlights the hydride nature of the hydrogens bound to the silicon. Since the hydrogens are hydridic, another reaction pathway could include SAMs with labile hydrogens that are Lewis bases. That is, organic groups such as alcohols, amines, thiols, to name a few, could react with the $SiH_4$ generating silyl ethers, amines and thiols, respectively. As before, with the silyl hydride bound to the surface, normal silicon growth can occur.

In an exemplary embodiment the cleaving of the R' groups of the SAM is carried out during deposition of the SAM material 203, allowing the Si atoms 204 to bond to the oxygen of the glass substrate 201. A dilute solution of approximately 1 mM to approximately 10 mM of the SAM material is dissolved in an organic solvent such as hexane, cyclohexane, or toluene. After cleaning of the glass substrate 201 with solvents, UV exposure, and/or oxygen plasma, it is soaked in the SAM solution for up to one hour. The substrates are then removed, rinsed, and dried. The hydrocarbon chains 205 are, therefore, $R—(CH_2)_N$. These hydrocarbon chains, along with the silicon atoms 204 are thus bonded to the glass substrate, and provide the highly ordered array, which is the seed of the crystal formation for the silicon in a later step.

Spacing between the molecules of the SAM layer 203 is controlled in part by the length of the hydrocarbon chains. The molecular spacing may be further modified by fluorinating all or part of the chain (i.e., converting $CH_2$ to $CF_2$), or by adding side hydrocarbon chains. In an exemplary embodiment the molecular spacing is substantially equal to the in-plane spacing of the semiconductor atoms in their hexagonal plane, or has an integral relationship (e.g. 2:1).

After the deposition of the SAM layer 203 is complete, a solution silylation or alkene termination as a seeding process may be carried out prior to the physical deposition process of amorphous silicon. For example, after the completion of the processing sequence of FIG. 2b, $HSi(OR)_3$ (where R is a methyl or an ethyl group) is carried out in the presence of a catalyst such as chloroplatinic acid. This sequence results in the structure shown in FIG. 2c, with the $Si(OR)_3$ shown at 207. Alternatively, the exposed functional groups 206, which are illustratively alkyl moeties 207 as shown in FIG. 2b, are reduced in-situ by $SiH_x$.

Figure 2D:
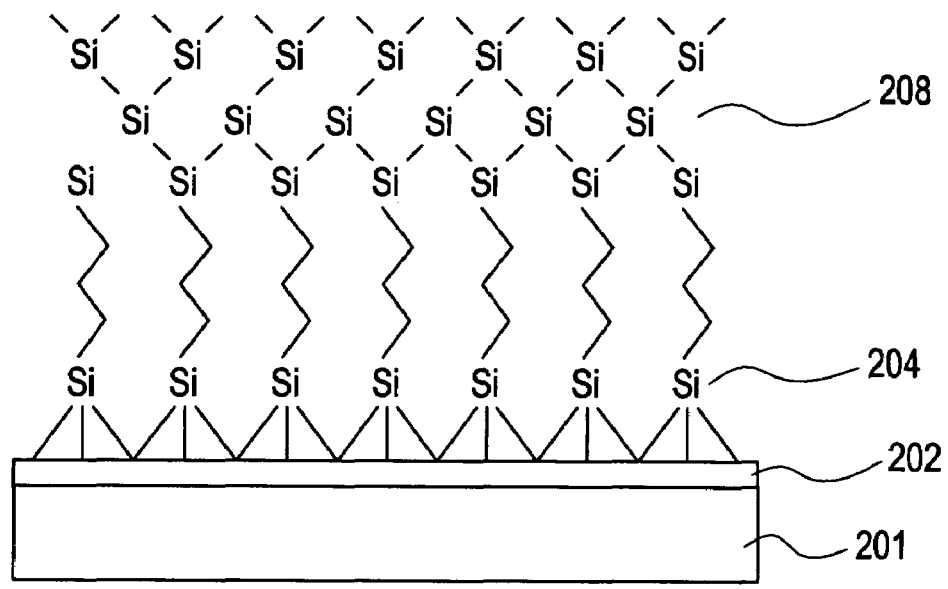
Figure 2E:
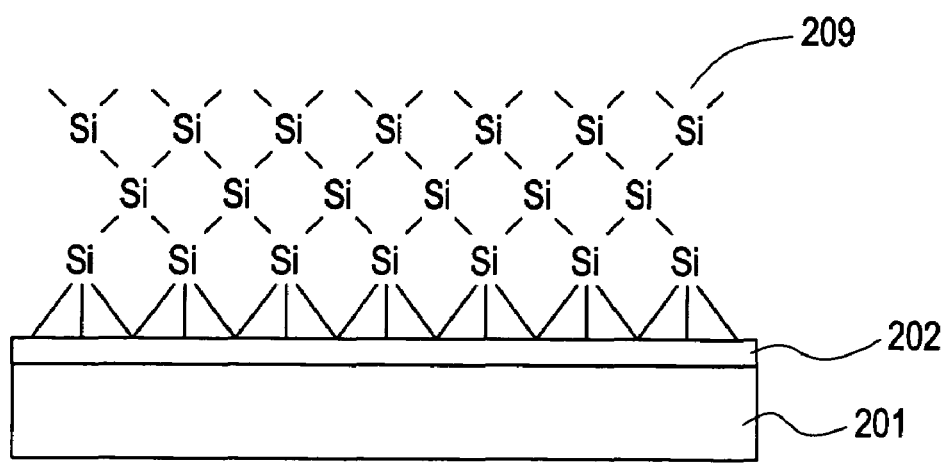

In either case, the seed layer has been effected, with the Si atoms 208 disposed at the ends of the SAM layer as shown in FIG. 2d. To this end, because the SAM layer 203 comprises molecules that are ordered in substantially the same manner, and with similar spacing as that of the crystal lattice of Si, when silicon 208 is deposited, the silicon 208 attaches to the seed silicon atoms as shown, and forms a rather ordered structure. The deposition of the silicon 208 is carried out using well-known techniques such as plasma enhanced chemical vapor deposition (PECVD), catalytic CVD, sputtering, or similar processes.

After the deposition of the silicon 208 is completed, the glass substrate may be annealed to more fully crystallize any amorphous regions in the silicon 208. The annealing step is carried out at approximately 400° C. to approximately less than 600° C. in an inert or reducing atmosphere for approximately 2 to approximately 72 hours. The above parameters of the anneal step are merely illustrative. For example, the upper limit of the anneal temperature is dependent on the substrate 201, and is set to avoid damaging the substrate 201. In general, the materials chosen for the SAM depend on the desired crystal to be formed (e.g., Si, SiGe, Ge), and the anneal step is carried out using furnace anneals, instead of other more costly and less reliable methods such as excimer laser annealing.

The described anneal step also results in the complete pyrolysis of the hydrocarbon chain 205. The resultant silicon crystalline structure 209 is illustratively a polycrystalline, or monocrystalline silicon, depending on the length of the order of the SAM used.

The grain sizes of polycrystalline silicon are illustratively on the order of approximately 1 μm to approximately 2 μm, with corresponding field effect mobility of carriers on the order of approximately 50 $cm^2$/Vsec to approximately 100 $cm^2$/Vsec. Moreover, since the crystallization of silicon crystalline structure 209 was controlled by the SAM layer 203 rather than by random nucleation, the carrier mobility has a high degree of uniformity. The variation of carrier mobility is less than approximately ±10%.

The larger grain sizes and higher carrier mobilities are beneficial to the improvement of the performance of the display, and allow for the ready integration of the drive circuitry on the display substrate. Furthermore, the use of high mobility silicon as described above also fosters the use of OLED devices, which have higher mobility and uniformity requirements than LCD, on display panels. Of course, the field effect mobility may be as great as 600 $cm^2$/Vsec or greater when the silicon 209 is monocrystalline and grown on SAM templates as discussed above.

In addition to the benefits of the exemplary embodiments referenced above, the methods and resultant structures of the exemplary embodiments foster integration of the switch and drive circuitry and of OLED devices on displays used in LCD and OLED applications. These devices have improved performance, reduced pixel size/increased pixel quantity due to the carrier mobility offered. Moreover, the need for external chip mounting for drive and switch circuits can be minimized, if not eliminated by the present method. Moreover, the organic SAM materials used in accordance with the exemplary embodiments pose a lesser risk of contaminating the silicon than other template processes, such as metal silicide processes. These and other advantages of the exemplary embodiments may also be realized in other crystal structures fabricated in accordance with these embodiments.

Figure 3:
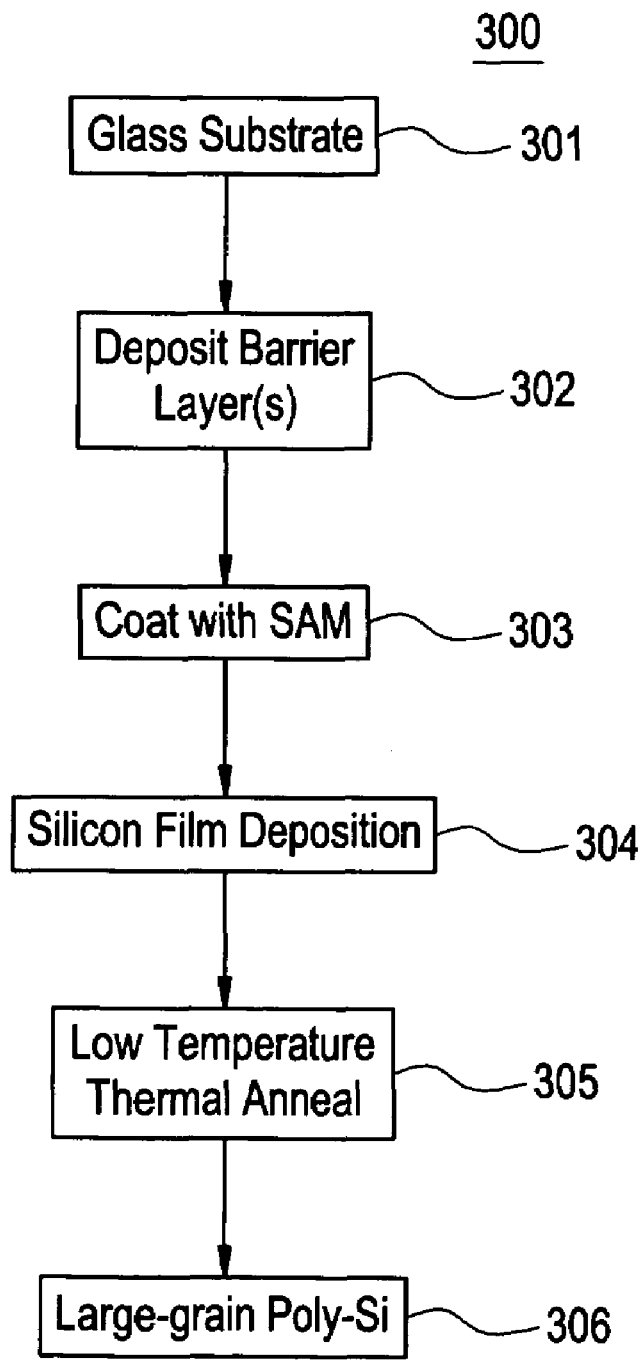
FIG. 3 is a flowchart of an illustrative process of forming crystalline structure on a glass substrate in accordance with an exemplary embodiment.

FIG. 3 is a flow chart of an illustrative processing sequence 300 for fabricating a display device such as display 100 according to an exemplary embodiment. It is noted that the processing sequence, materials and process parameters, in many instances, are substantially the same as the description of the processes of the exemplary embodiments described in connection with FIGS. 2a–2e above. To the extent that these are applicable to the process of the exemplary embodiment of FIG. 3, these are not repeated.

The glass substrate is provided at 301, and a barrier layer is disposed thereover at step 302. The barrier layer is used to block migration of contaminants from the substrate into the device region. The barrier layer commonly consists of silicon nitride, silicon dioxide, or a combination of the two, and is typically deposited by chemical vapor deposition (CVD) to a thickness of 100 to 500 nm. After the disposition of the barrier layers the SAM material is deposited over the substrate at step 303. After the SAM deposition, the silicon layer is deposited at step 304. This is followed by a relatively low-temperature thermal anneal step 305, which substantially eliminates any amorphous silicon, forming the crystalline silicon instead, and pyrolizes the SAM layer. This results in the formation of substantially large grain polysilicon or monocrystalline silicon on the surface of the substrate at step 306.

The invention having been described in detail in connection through a discussion of exemplary embodiments, it is clear that modifications of the invention will be apparent to one having ordinary skill in the art having had the benefit of the present disclosure. Such modifications and variations are included in the scope of the appended claims.

What is claimed is:

1. A method of fabricating a monocrystalline or polycrystalline material over a substrate, comprising:
   depositing a self-assembled monolayer (SAM) over the substrate;
   depositing a layer over the SAM; and
   substantially crystallizing the layer, whereby crystallizing the layer comprises annealing the substrate;
   wherein the annealing is carried out at a temperature that is less than a strain point of the substrate.

2. A method as recited in claim 1, wherein the SAM material comprises molecules, which have an order and spacing that substantially matches an order and spacing of a lattice of the material.

3. A method as recited in claim 1, wherein the polycrystalline material is polycrystalline silicon.

4. A method as recited in claim 1, wherein the monocrystalline material is monocrystalline silicon.

5. A method as recited in claim 1, wherein the SAM layer is a compound of R—$(CH_2)_N$—Si—$R'_3$, and the R' groups are cleaved during die providing of the SAM layer over the substrate.

6. A method as recited in claim 1, wherein the SAM layer is a compound of R—$(CH_2)_N$—Si—$R'_3$, and the R' group are cleaved during the depositing of the SAM layer over the substrate.

7. A method of fabricating a monocrystalline or polycrystalline material over a substrate, comprising:
   depositing a self-assembled monolayer (SAM) over the substrate;
   depositing a layer over the SAM;
   substantially crystallizing the layer; and
   wherein the material is a semiconductor.

8. A method as recited in claim 7, wherein the semiconductor is chosen from the group consisting essentially of: silicon, germanium and silicon-germanium.

9. A method as recited in claim 7, wherein the substrate is an oxide of the semiconductor.

* * * * *